United States Patent
Wang

(10) Patent No.: US 10,615,475 B2
(45) Date of Patent: Apr. 7, 2020

(54) TWO-PORT, THREE-PORT AND FOUR-PORT NON-RECIPROCAL DEVICES WITH SEQUENTIALLY SWITCHED DELAY LINES (SSDL)

(71) Applicant: THE REGENTS OF THE UNIVERSITY OF CALIFORNIA, Oakland, CA (US)

(72) Inventor: Yuanxun Ethan Wang, Manhattan Beach, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 126 days.

(21) Appl. No.: 15/692,091

(22) Filed: Aug. 31, 2017

(65) Prior Publication Data

US 2018/0219269 A1 Aug. 2, 2018

Related U.S. Application Data

(60) Provisional application No. 62/452,818, filed on Jan. 31, 2017.

(51) Int. Cl.
*H01P 1/18* (2006.01)
*H01P 1/383* (2006.01)
(Continued)

(52) U.S. Cl.
CPC ............... *H01P 1/383* (2013.01); *H01P 1/15* (2013.01); *H01P 1/184* (2013.01); *H01P 1/387* (2013.01);
(Continued)

(58) Field of Classification Search
CPC ............... H01P 1/38; H01P 1/18; H01P 1/184
(Continued)

(56) References Cited

U.S. PATENT DOCUMENTS 5,347,239 A 9/1994 Loehner et al.
7,724,107 B2 5/2010 Miya
(Continued)

FOREIGN PATENT DOCUMENTS

WO 2004015809 A2 2/2004

OTHER PUBLICATIONS

ISA/US, United States Patent and Trademark Office, International Search Report and Written Opinion dated Jan. 2, 2018, related PCT international application No. PCT/US2017/055468, pp. 1-11, with claims searched, pp. 12-17.
(Continued)

*Primary Examiner* — Stephen E. Jones
(74) *Attorney, Agent, or Firm* — O'Banion & Ritchey LLP; John P. O'Banion

(57) ABSTRACT

Sequentially-Switched Delay Line (SSDL) can realize passive, nonmagnetic and non-reciprocal components for electromagnetic waves over ultra-wideband through the breaking of the time-reversal symmetry. A SSDL structure with six sections of transmission lines and five Single Pole Double Throw (SPDT) switches has been proposed as a three-port circulator in the literature. In this disclosure, a simpler structure consisting of only two sections of transmission lines with two switches is proposed, which can operate as a two-port non-reciprocal phase shifter (gyrator) with two SPDT switches, a three-port circulator with one DPDT switch and one SPDT switch, or a four-port circulator with two DPDT switches. Simulation results for one design at radio frequency demonstrated the expected non-reciprocal behavior from DC to 1.5 GHz for aforementioned three configurations.

26 Claims, 8 Drawing Sheets

(51) Int. Cl.
| | |
|---|---|
| *H01P 1/15* | (2006.01) |
| *H01P 1/387* | (2006.01) |
| *H01P 5/18* | (2006.01) |
| *H01P 1/397* | (2006.01) |
| *H03K 5/159* | (2006.01) |
| *H03K 17/693* | (2006.01) |
| *H03K 5/00* | (2006.01) |

(52) U.S. Cl.
CPC ............... *H01P 1/397* (2013.01); *H01P 5/18* (2013.01); *H03K 5/159* (2013.01); *H03K 17/693* (2013.01); *H03K 2005/00019* (2013.01)

(58) Field of Classification Search
USPC .................. 333/1.1, 24.2, 156, 161, 164
See application file for complete search history.

(56) References Cited

U.S. PATENT DOCUMENTS 10,116,029 B2    10/2018   Wang
2004/0001020 A1   1/2004   Huettner
2007/0274238 A1  11/2007   Kim

OTHER PUBLICATIONS

Biedka, Matthew Michael, "Ultra Wide-Band Circulator through Sequentially-Switched Delay Line (SSDL)", University of California, Los Angeles, Thesis filed with eScholarship.org, published Jun. 27, 2016, 51 pages.

ISA/US, International Search Report and Written Opinion dated Aug. 2, 2017, PCT international application No. PCT/US2017/031800, pp. 1-10, with claims searched, pp. 11-16.

Wang, Yuanxun Ethan, et al_, "Abstract in response to DARPA-BAA-16-20: Chip-Scale RF Signal Processing for Future Radios", submitted Mar. 11, 2016, pp. 1-9.

European Patent Office (EPO), Communication (the extended European search report) dated Jun. 26, 2018, related European patent application No. 18153590.7, pp. 1-10, claims searched, pp. 11-13.

Biedka, Mathew M. et al., "Ultra-Wide Band Non-reciprocity through Sequentially-Switched Delay Lines", Scientific Reports, 7:40014, Jan. 6, 2017, pp. 1-16.

Bahl, Inder J., "Switches", in control Components Using Si, GaAs, and GaN Technologies, Chapter 3, Artech House, 2014, pp. 67-81.

TWO-PORT, THREE-PORT AND FOUR-PORT NON-RECIPROCAL DEVICES WITH SEQUENTIALLY SWITCHED DELAY LINES (SSDL)

CROSS-REFERENCE TO RELATED APPLICATIONS

This application claims priority to, and the benefit of, U.S. provisional patent application Ser. No. 62/452,818 filed on Jan. 31, 2017, incorporated herein by reference in its entirety.

STATEMENT REGARDING FEDERALLY SPONSORED RESEARCH OR DEVELOPMENT

Not Applicable

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document may be subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technical Field

The technology of this disclosure pertains generally to non-reciprocal components, and more particularly to non-reciprocal sequentially-switched delay line (SSDL) gyrators and circulators.

2. Background Discussion

Reciprocity is generally observed in passive components fabricated from electric material due to the time-reversal symmetry of the material property. In the past passive non-reciprocal components could only be realized by use of non-reciprocal magnetic material, which is often narrow band, bulky, expensive and is not compatible with modern integrated circuit process.

More recently, active circulators implemented with transistors have been realized based on the non-reciprocal transfer behavior of transistors. In comparison with traditional circulators, these circulators offer smaller physical size and have greater compatibility with integrated circuit (IC) technology.

However, as in many other transistor based devices, active circulators tend to suffer from noise issues and have limited power performance. These shortcomings often prevent active circulators from being utilized in systems requiring wide dynamic range. Non-reciprocity has been realized through modulating the dielectric property of a transmission line in time and space to break the time reversal symmetry. For RF applications, a time-modulation architecture has been applied to a parametrically coupled resonator and a commutating switched capacitor device to achieve magnet-less non-reciprocity, yet with an isolation bandwidth which is intrinsically narrow.

In addition, broadband isolation at RF frequencies has been demonstrated on a Monolithic Microwave Integrated Circuit (MMIC) based on Time-Varying Transmission Line (TVTL). However, despite the ability to offer broadband isolation, its lowest operating frequency is dictated by the longest delay of the TVTL that can be implemented on chip, thus resulting in a large chip area for low RF frequencies. Furthermore, the extent of isolation of the TVTL isolator over a broad bandwidth is also limited by a SINC function.

Toward achieving non-reciprocity without limiting the lower bound of operating frequency, Sequentially-Switched Delay Line (SSDL) devices were developed to create a passive circulator over a very broad frequency range from almost DC to RF. The SSDLs combine time-reversal symmetry breaking with multiplexing/demultiplexing offered by high-speed switches to route the waves traveling in opposite directions to different ports in a seamless manner. The time switching strategy emulates real-time traffic control with no theoretical bandwidth limit. A circulator can thus be built allowing simultaneous transmit and receive (STAR) of the electromagnetic waves without stops or reflections, yet providing theoretically infinite isolation between the two.

Accordingly, a need exists for SSDL devices which can be implemented with reduced components counts and sizes toward minimizing integrated circuit real estate. The present disclosure fulfills that need and provides additional benefits.

BRIEF SUMMARY

A solution is described to the problem of separating simultaneous transmit and receive signals at the same frequency in wireless communication systems or radar/sensor systems, to protect the receiver being interfered with by the transmitter.

The technology is based on sequentially turning on and off of the switches that are connected to multiple segments of delay lines. The approach is similar one's daily experience that one-way traffic synchronized with the turning on of multiple green lights can pass all the way without stopping, but the traffic in the other direction will experience delay. The technology offers a true passive solution than can enable circulators to be fabricated on-chip for operation in a frequency range (e.g., just above DC to the frequency of light).

The technology offers a practical, robust and cost efficient way of implementing high performance circulators that can be integrated on chip. The technology can be implemented in basically any wireless transmitters and radar sensor systems that require reciprocity.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The technology described herein will be more fully understood by reference to the following drawings which are for illustrative purposes only:

DETAILED DESCRIPTION

1. Introduction

The present disclosure describes general realizations of non-reciprocal devices based on SSDL including two-port non-reciprocal phase shifters (gyrators), three-port circulators and four-port circulators. The proposed non-reciprocal devices are based on a simpler structure than those found in the current state of the art, as the disclosed devices require just two sections of transmission lines and two switches. Benefits from utilizing these simplified structures include reduced chip area and lower insertion loss in on-chip implementations.

2. Technical Approach

Figure 1A:
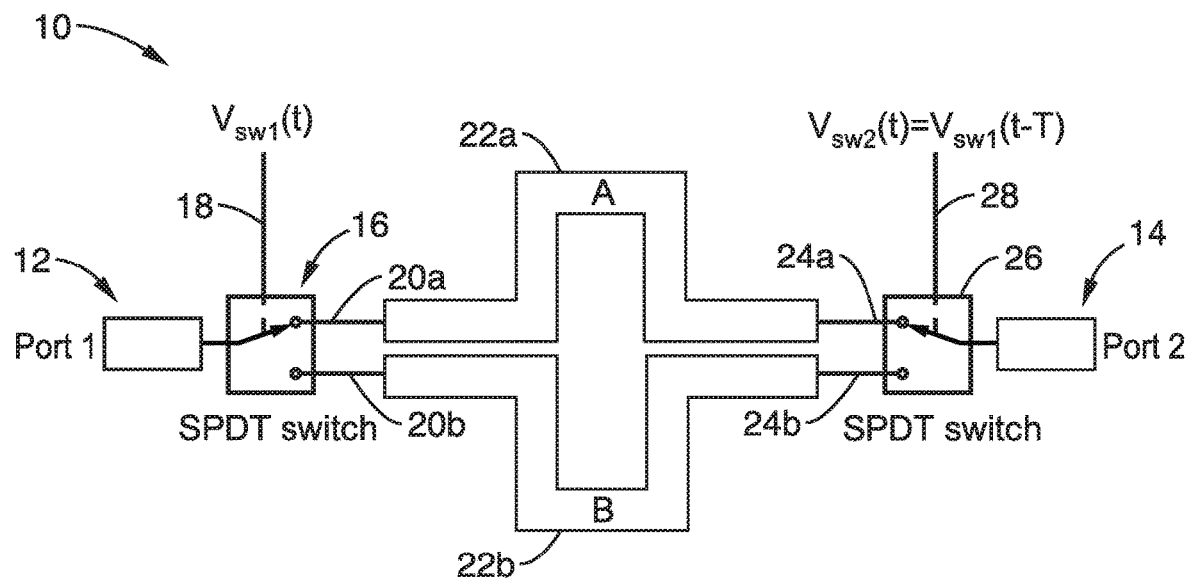
FIG. 1A and FIG. 1B are a schematic and associated switch control signals of a 2-port non-reciprocal phase shifter (gyrator) based on SSDL, according to an embodiment of the present disclosure.
Figure 1B:
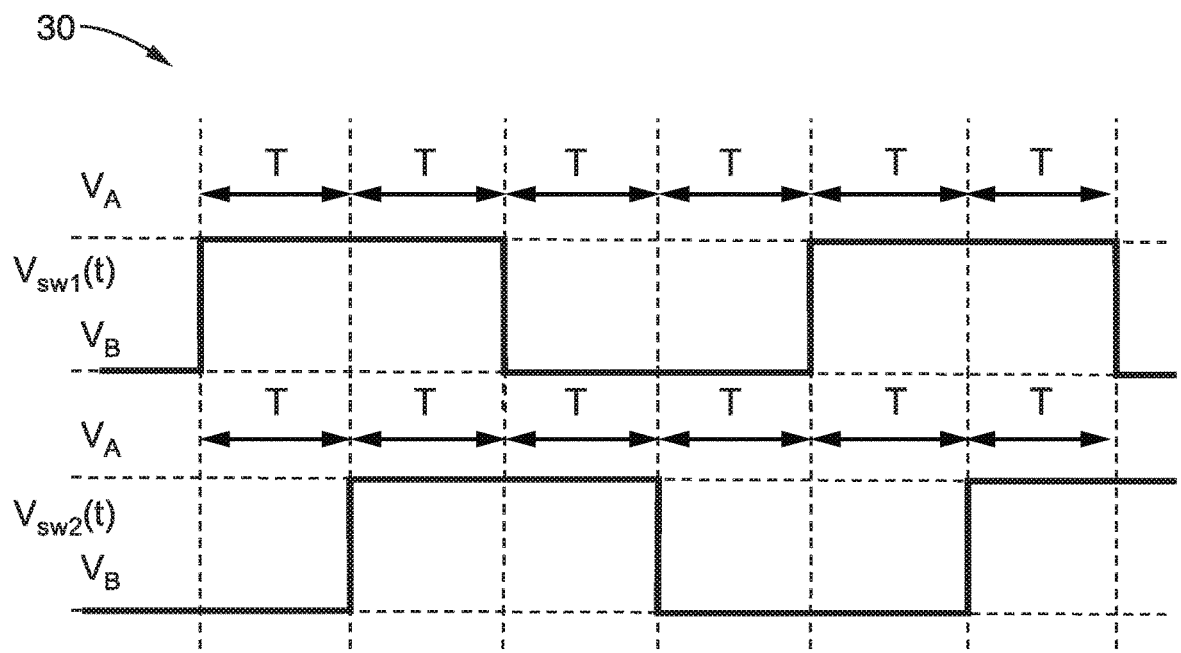

FIG. 1A and FIG. 1B illustrate an example embodiment of a two-port non-reciprocal phase shifters, showing a schematic of embodiment 10 in FIG. 1A and a switch control diagram 30 seen in FIG. 1B.

In FIG. 1A the non-reciprocal phase shifter 10 has a first port 12 a second port 14 and comprises two identical sections of transmission lines 22a, 22b with a delay time of T. First port 12 is coupled through the common line on an SPDT switch 16 to select between lines 20a, 20b in response to receiving control signal $V_{sw1}(t)$ 18. It will be noted that an SPDT switch has a common line which can be switched to connect to either of a first or second switched connection. Lines 20a, 20b connect through transmission line segments 22a, 22b (A and B), then through connections 24a, 24b into switched connections of switch 26, whose state is controlled by signal $V_{sw2}(t)=V_{sw1}(t-T)$ 28, with the common connection of the switch coupled to second port 14.

Thus, the two SPDT switches perform switching between these two lines. In particular, it is seen that a signal at port 1 can be directed by switch 16 to transmission line 22a or 22b, with switch 26 then selecting whether to connect to 22a or 22b, which is directed to second port 14. It should also be appreciated that although the above described a single signal direction of travel, the device embodiment of FIG. 1A as well as the other embodiments are bi-directional; which is to say they control signal movement in both directions.

In FIG. 1B is seen the signals 30 for controlling switching of $V_{sw1}(t)$ 18 seen in the upper waveform, and switching of $V_{sw2}(t)$ 28 in the lower waveform. The switches are controlled by the use of substantially rectangular waveforms that have a period of 4T, with a bi-level voltage selecting the connection to either line A ($V_A$) or line B ($V_B$). Within each period, the switches connect the two ports to one of the two transmission lines, e.g., line A 22a, for a time duration of 2T before they are switched to the other line, e.g., line B 22b for another 2T.

Denoting the port at the left as port 1 12 and the one at the right as port 2 14, one may select the switching pattern shown in FIG. 1A so that port 2 is connected to the same line with port 1 always behind a fixed time of T. The electromagnetic wave launched into port 1 is split into two pulses with a duration of 2T that are propagating on the two lines respectively. Each pulse propagates on one of the transmission lines. This pulse requires a time duration of T to arrive at the end of that line next to port 2, at which moment the switch is turned to that line to connect it to port 2. Therefore, the two split pulses are combined at port 2 without loss of the information or enduring an extra delay. On the contrary, if the wave is launched into port 2, the pulses will arrive at the end of the line next to port 1 when the switch is turned away, disconnecting that line from port 1. Therefore, this pulse launched into port 2 will be reflected by the port 1 switch, traveling back to port 2 and being reflected once again by the port 2 switch, traveling toward port 1 again and finally arriving at port 1 after a time duration of 3T. Therefore, one may express the voltage transfer relationship between port 1 and 2 as follows, $$\begin{cases} V_2^-(t) = V_1^+(t-T) \\ V_1^-(t) = V_2^+(t-3T) \end{cases} \quad (1)$$

It is thus evident from Eq. 1 that a non-reciprocal phase shifter/delay line or gyrator is created with the SSDL structure shown in FIG. 1A.

Figure 2A:
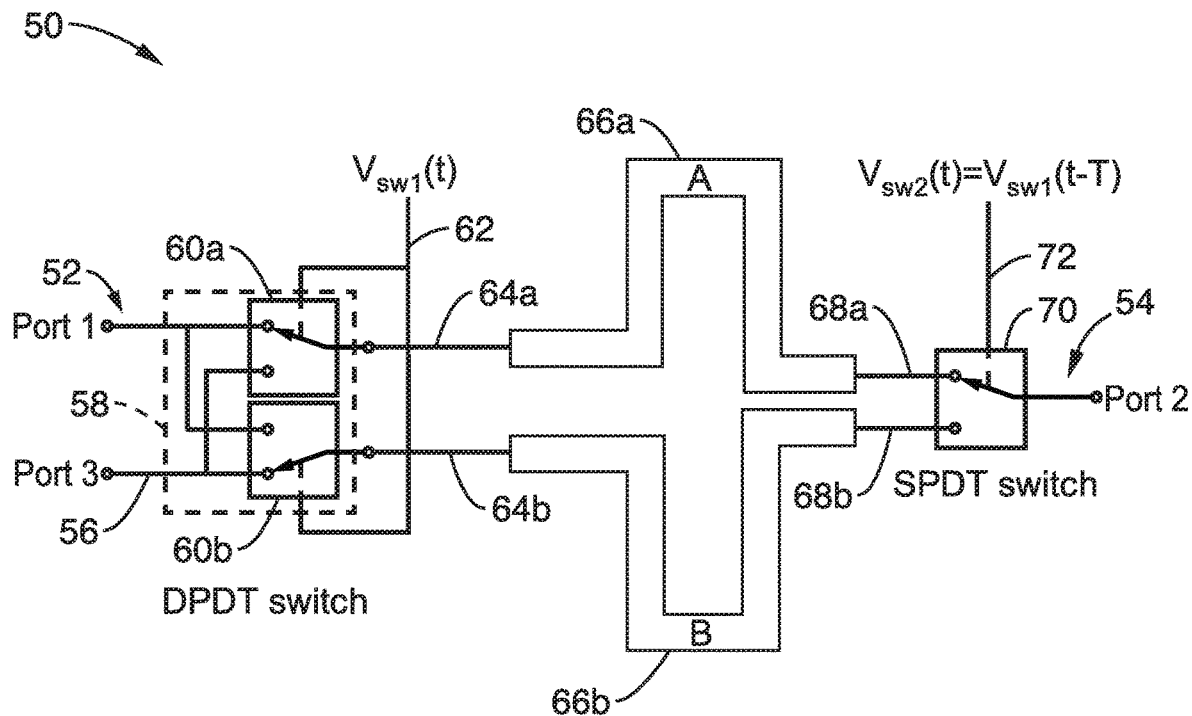
FIG. 2A and FIG. 2B are a schematic and associated switch control signals of a 3-port circulator based on SSDL, according to an embodiment of the present disclosure.
Figure 2B:
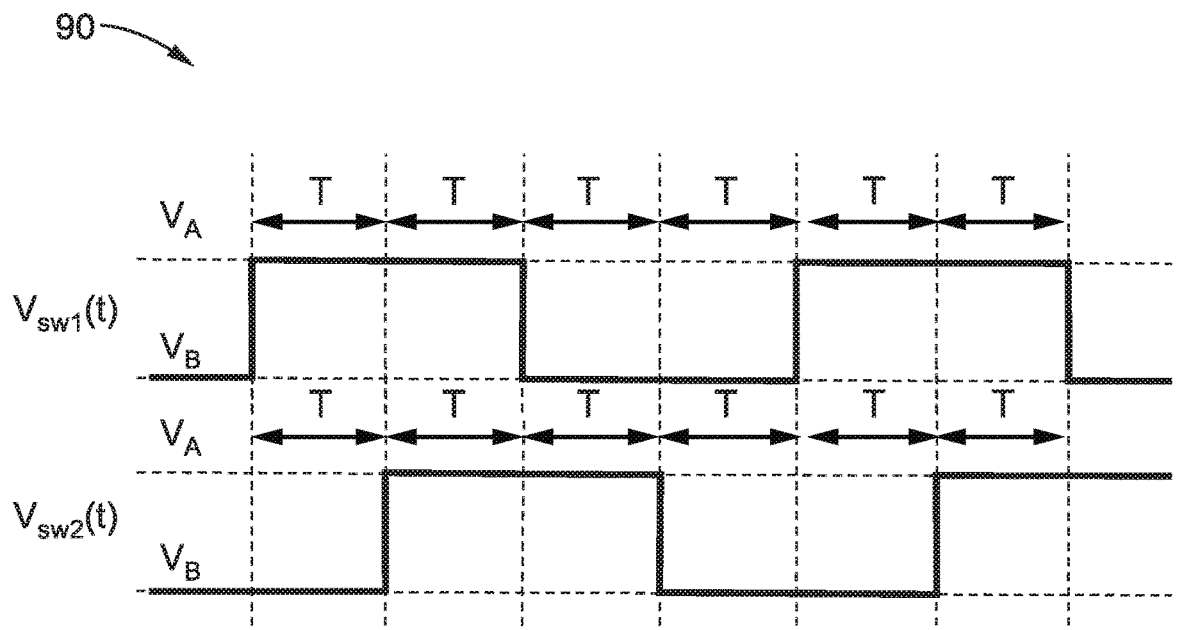

FIG. 2A through FIG. 2B illustrates an example three-port circulator embodiment 50 with example switching waveforms 90. To create a three-port circulator, the SPDT switch at port 1 12 from FIG. 1A is replaced with a DPDT switch that forms the third port. Port 1 52 and port 3 56 connections are each seen split into two lines which are coupled to a DPDT switch 58, comprising two interconnected SPDT switches shown as a first switch 60a and a second switch 60b, whose state is both switched in response to signal 62 $V_{sw1}(t)$. Switch 60a has output 64a, with switch 60b having output 64b, with these outputs coupled to transmission lines A 66a, and B 66b, respectively. Connections 68a, 68b from the transmission lines connect to switched connections of switch 70 whose common connection is coupled to port 2 54. The state of switch 70 is controlled in response to the signal $V_{sw2}(t)=V_{sw1}(t-T)$ 72.

It will be appreciated that the DPDT switch interconnects the two SPDT switches so that when the switch is in a first state, port 1 52 couples to transmission line A 66a with port 3 56 coupling to transmission line 66b. In a second switch state, port 1 52 couples to transmission line B 66b with port 3 56 coupling to transmission line A 66a.

The wave launched into port 2 54 now travels to port 3 56 through the DPDT switch 58 with a time delay of T, instead of being reflected by the SPDT next to port 1 52. However, a wave launched into port 3 still experiences reflection at the SPDT next to port 2 54 and finally arrives at port 1 after a time delay of 2T. In FIG. 2B is shown an embodiment of control waveforms 90, showing $V_{sw1}(t)$ and $V_{sw2}(t)$, and the periods T of the rectangular waveforms.

Thus, this embodiment results in one-half of the delay and a much simpler structure than found in current devices. The voltage transfer relationship for this three port device is summarized as follows, $$\begin{cases} V_2^-(t) = V_1^+(t-T) \\ V_3^-(t) = V_2^+(t-T) \\ V_1^-(t) = V_3^+(t-2T) \end{cases} \quad (2)$$

Figure 3A:
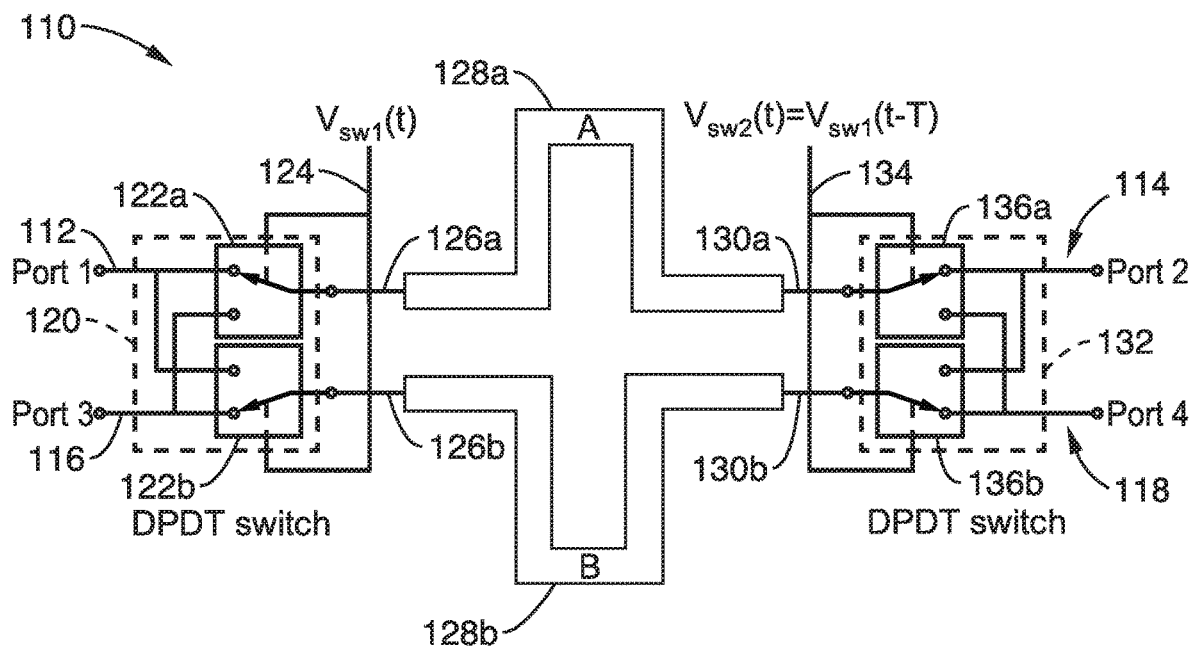
FIG. 3A and FIG. 3B are a schematic and associated switch control signals of a 4-port circulator based on SSDL, according to an embodiment of the present disclosure.
Figure 3B:
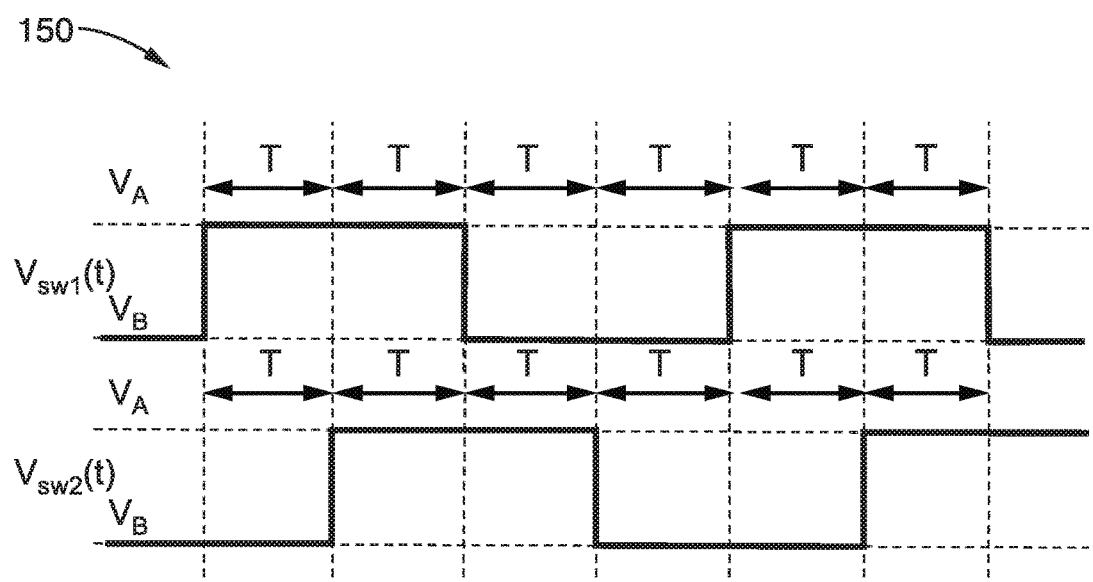

FIG. 3A and FIG. 3B illustrate an example four-port circulator embodiment 110 with example switching waveforms 150. Port 1 112 and port 3 116 are each seen split into two lines which are coupled to DPDT switch 120, as was seen in FIG. 2A, which comprises two interconnected SPDT switches shown as a first switch 122*a* and a second switch 122*b*, whose state is both switched in response to signal $V_{sw1}(t)$ 124. Common connections 126*a*, 126*b* from the common outputs of DPDT switch 120 are coupled to transmission line A 128*a*, and transmission line B 128*b*. Connections 130*a*, 130*b* from transmission lines A 128*a* and B 128*b*, connect to common connections of another DPDT switch 132, comprising interconnected SPDT switches 136*a*, 136*b*. Switching state of DPDT switch 132 is both controlled by signal $V_{sw2}(t)=V_{sw1}(t-T)$ 134, which is seen in FIG. 3B. The four switched outputs from DPDT switch 132 are combined and connected to port 2 114 and port 4 118. In a first state of switch 132, transmission line A 128*a* is coupled to port 2 114 while transmission line B 128*b* is coupled to port 4 118. In a second state of switch 132, transmission line A 128*a* is coupled to port 4 118 while transmission line B 128*b* is coupled to port 2 114.

In FIG. 3B is shown an embodiment of control waveforms 150, showing $V_{sw1}(t)$ and $V_{sw2}(t)$, and the periods T of the rectangular waveforms, which can be the same as utilized for controlling the devices of FIG. 1A and FIG. 2A.

The above example provides a further extension of the three-port device to a four-port device, by replacing the remaining SPDT switch with a DPDT switch, to arrive at a physically symmetrical devices. Under the same sequential switching pattern, it can be easily derived that this device operates as a four-port circulator with the following voltage transfer relationship, $$\begin{cases} V_2^-(t) = V_1^+(t-T) \\ V_3^-(t) = V_2^+(t-T) \\ V_4^-(t) = V_3^+(t-T) \\ V_1^-(t) = V_4^+(t-T) \end{cases} \quad (3)$$

It should be appreciated that the delay among the four ports are completely symmetrical now.

Figure 4:
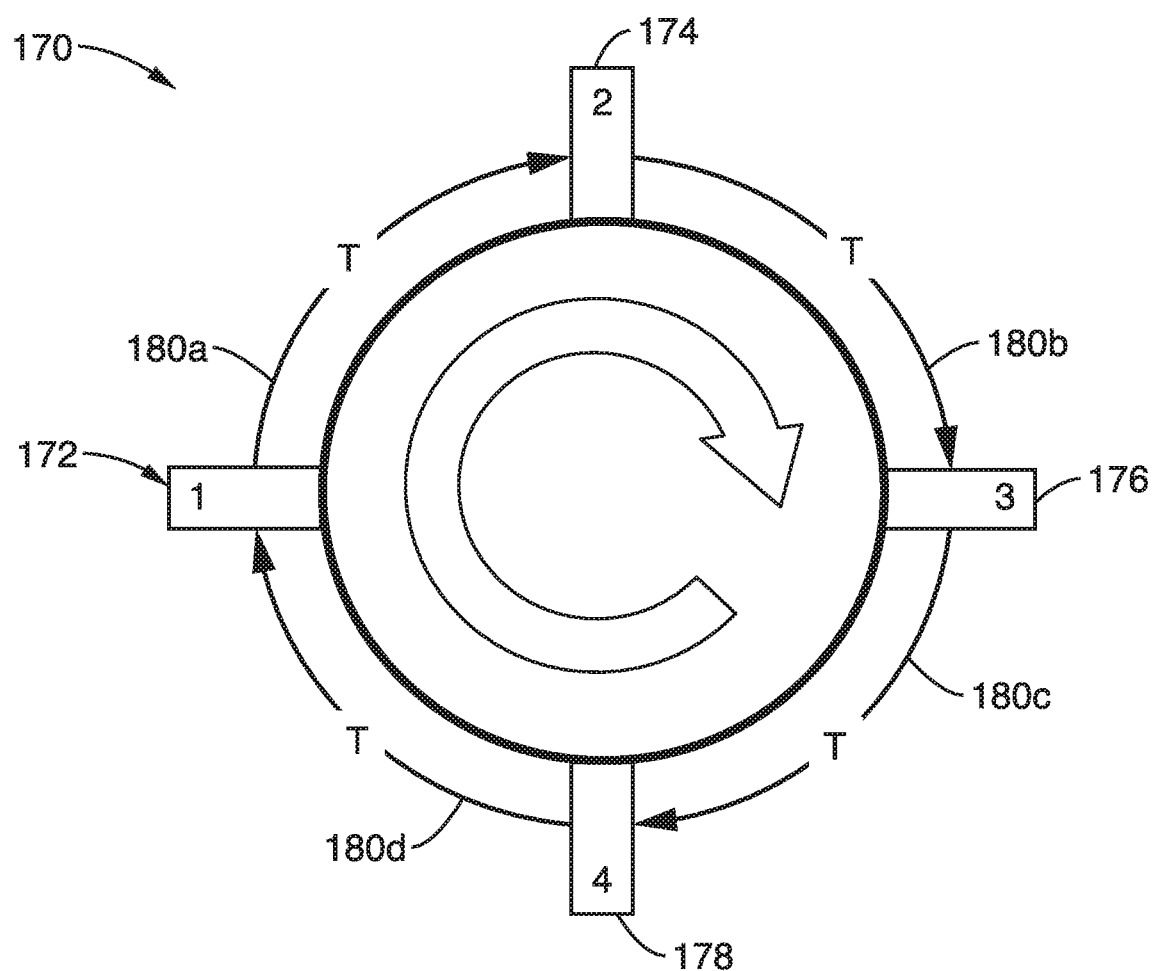
FIG. 4 is a representative symbol utilized for the 4-port circulator showing clockwise port transfer characteristics, according to an embodiment of the present disclosure.

FIG. 4 depicts a 4-port circulator symbol 170 which represents the wave propagation behavior of the four port device in which waves launched into the structure only travel clockwise to the next port with a time delay of T. The symbol is shown with port 1 172 with a delay/transmission line 180*a* represented with delay T reaching port 2 174, that has a delay/transmission line 180*b* with delay T reaching port 3 176, that has a delay/transmission line 180*c* with delay T reaching port 4 178, that has a delay/transmission line 180*d* with delay T reaching port 1 172.

The three-port circulator can be considered as a special case of the four-port circulator with port 4 178 is being open, while the two-port gyrator can thus be derived by opening circuits on both port 3 176 and port 4 178.

3. Design Considerations

It is worth noting that there is no absolute requirement of either switching time or delay length enforced by the Sequentially-Switched Delay Line (SSDL) operation except the synchronization between the two. In theory, the circulator concept is valid at frequencies above the low Kilohertz range (e.g., >5 KHz) to any frequency assuming switches and delay lines operating at those frequencies are available, which means hundreds of Gigahertz to the Terahertz range and even into the visible light regime. A high switching frequency implies that a short delay line can be used which is suitable for on-chip integration. The switching speed (speed of turning on and off) of the switches is crucial to device performance as faster switches will incur less switching noise caused by the blanking of the signal during the transition time.

Figure 5A:
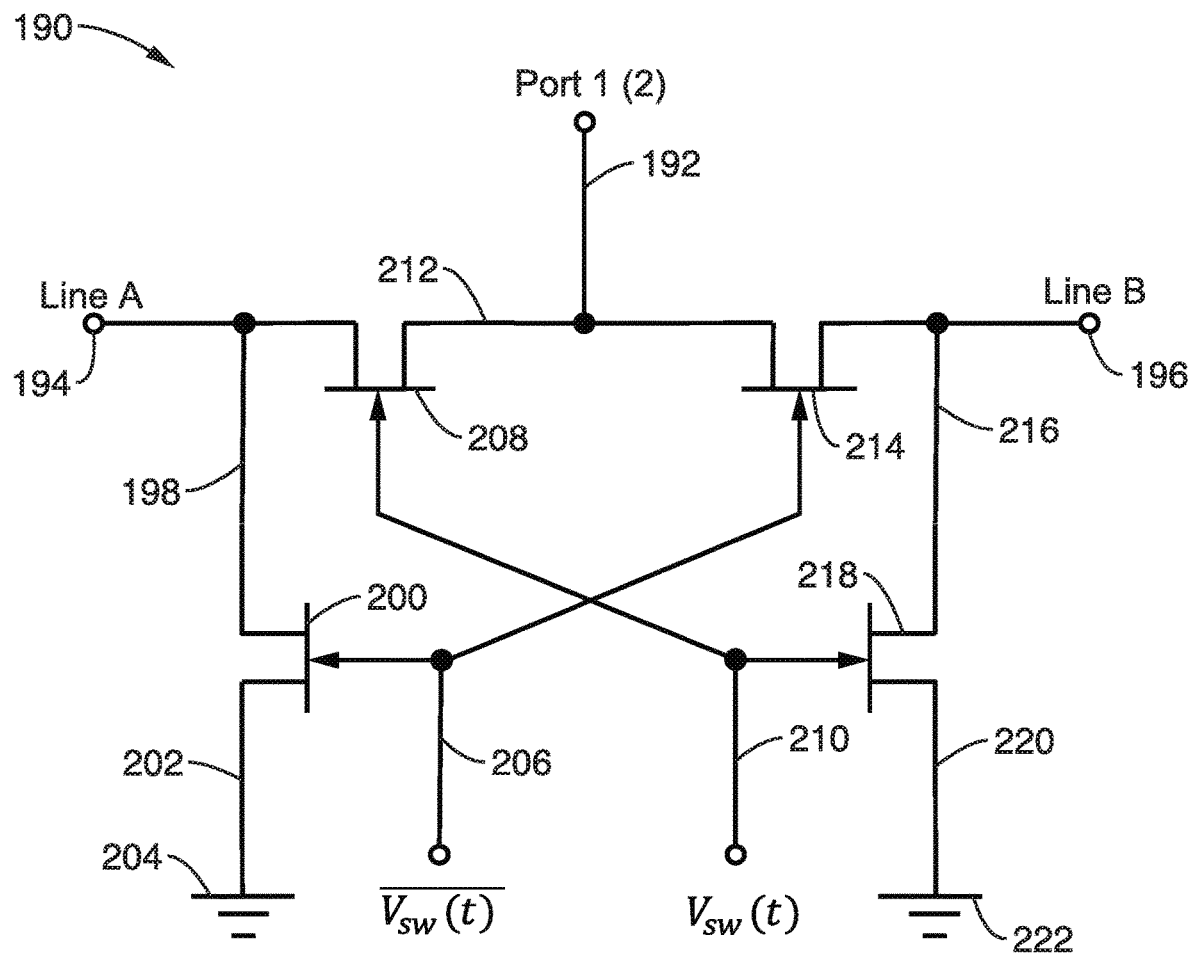
FIG. 5A and FIG. 5B are schematic diagrams of transistorized SPDT switches shown in FIG. 5A with short circuit reflection when turned off, and in FIG. 5B with switches having open circuit reflection when turned off, according to embodiments of the present disclosure.
Figure 5B:
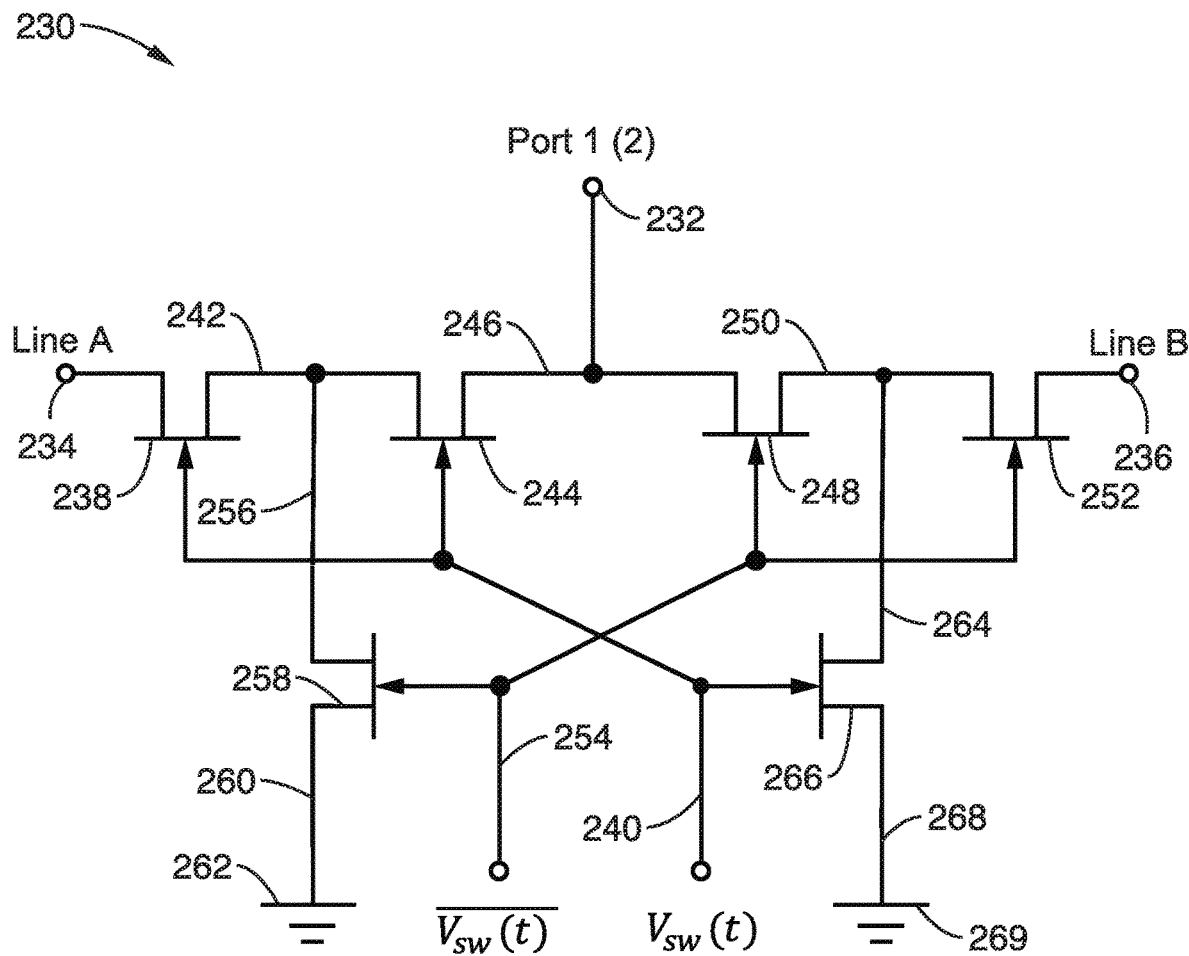

FIG. 5A and FIG. 5B illustrate two example embodiments 190, 230 (reference designs) of an RF SPDT switch showing interconnected transistors. In FIG. 5A the switch provides a short circuit to the transmission lines when turned off and the switch in FIG. 5B provides open circuit reflection to the ports that are turned off.

In FIG. 5A port 1 192 is the common line (connection) of the switch and is seen connecting into line 212 between transistors 208, 214, which respectively connect to switched line 194 and switched line 196, respectively. A first shunt transistor 200 is shown coupling through connection 198 to line 194, then from transistor 200 through connection 202 to ground 204, with a second shunt transistor 218 coupling through connection 216 to line 196, and from transistor 218 through connection 220 to ground 222. A control signal $V_{sw}(t)$ 210 is seen coupled to the gates of transistors 208, 218, while the inverse signal $V_{sw}(t)'$ 206 is seen coupled to the gates of transistors 200 and 214. It will be appreciated that $V_{sw}(t)$ with its inverse signal are readily obtained from differential control outputs.

In FIG. 5B the circuit is similar to that of FIG. 5A, but utilizes additional transistors to isolate the non-selected switched output, instead of shorting it to ground.

Port 1 232 is the common connection for the switch and connects into line 246 between transistors 244, 248 which control switch selection. Another transistor 238 is coupled by connection 242 outboard of transistor 244, with a counterpart transistor 252 coupled by connection 250 outboard of transistor 248. The outward side of transistor 238 is connected to switched output 234, while the outward side of transistor 252 is connected to switched output 236. A first shunt transistor 258 is shown coupling through connection 256 to line 242, then from transistor 258 through connection 260 to ground 262, with a second shunt transistor 266 coupling through connection 264 to line 250, and from transistor 266 through connection 268 to ground 269. A control signal $V_{sw}(t)$ 240 is seen coupled to the gates of transistors 238, 244 and 266, while its inverse signal $V_{sw}(t)'$ 254 is seen coupled to the gates of transistors 248, 252 and 258. It will be appreciated that $V_{sw}(t)$ with its inverse counterpart are readily obtained from differential control outputs.

It should be appreciated that either FIG. 5A or FIG. 5B can be utilized in the 2-port device of FIG. 1A and the 3-port device in FIG. 2A.

Figure 6:
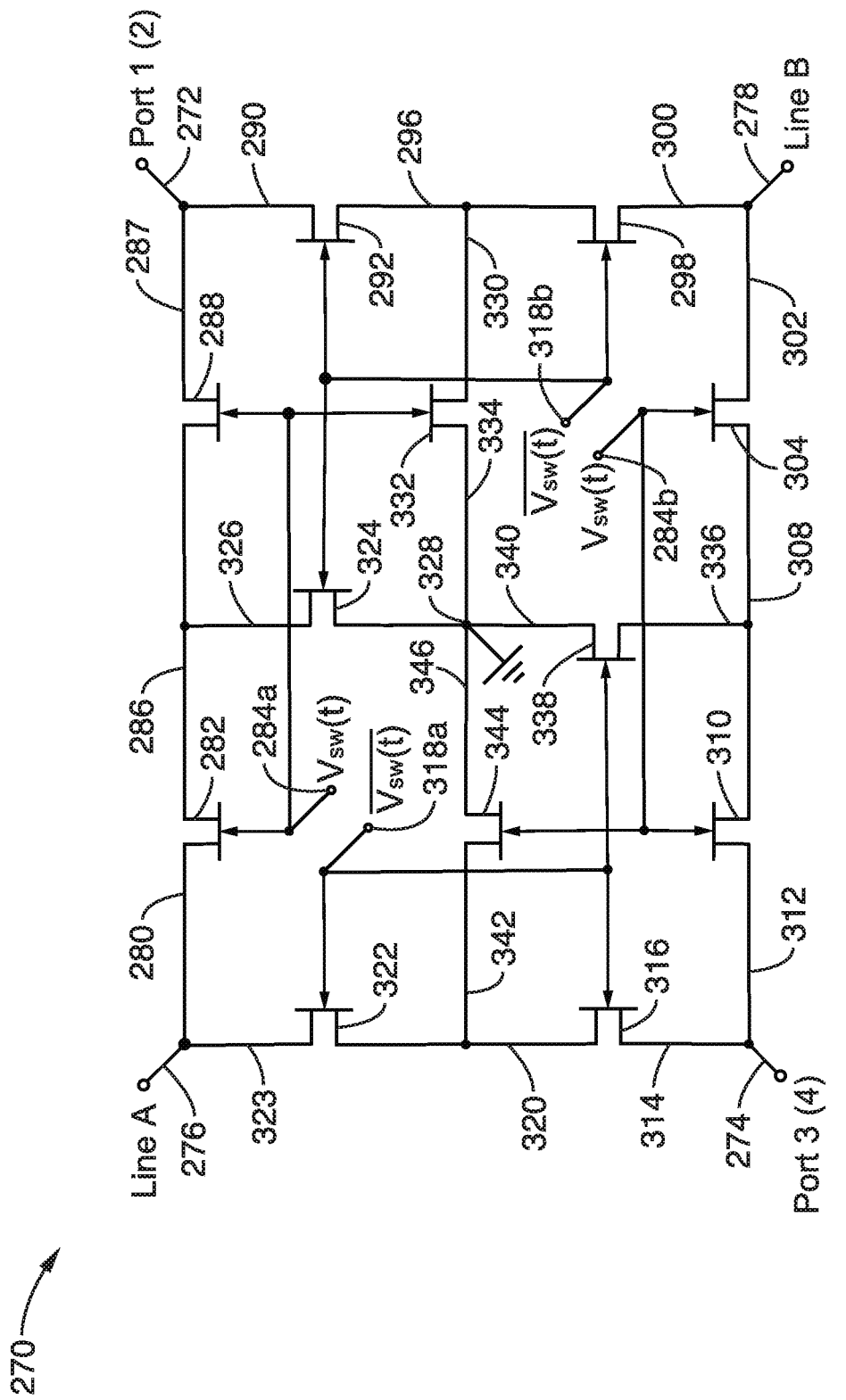
FIG. 6 is a schematic of an example DPDT switch designed with transistors that can be utilized in the three-port and four-port circulators, according to an embodiment of the present disclosure.

FIG. 6 illustrates an example embodiment of a DPDT switch comprising a cross-connection of two open circuit SPDT switches (e.g., FIG. 5B), which may be utilized for creating DPDT switches as utilized in FIG. 2A and FIG. 3A.

In the figure is seen the first and second common lines 272, 274 and switched connections 276, 278. Connection 280 is coupled from switched connection 276 (Line A) to transistor 282 which is coupled through connection 286 to transistor 288 whose output connects 287 to common line 272 (Port 1, 2). Connection 290 is coupled from first common connection 272 (Port 1, 2) to transistor 292 which is coupled through connection 296 to transistor 298 whose output 300 connects to switched line 278 (Line B). Connection 302 is coupled from switched connection 278 (Line B) to transistor 304 which is coupled through connection 308 to transistor 310 whose output connects 312 to second common line 274 (Port 3, 4). Connection 314 is coupled from second common lines 274 (Port 3, 4) to transistor 316 which is coupled through connection 320 to transistor 322 whose output 323 connects to switched line 276 (Line A).

The shunt circuits are seen interior of this circuit connecting to ground 328. The first side of transistor 324 is connected 326 to line 286 with its opposing side connected to ground 328. The first side of transistor 332 is connected 330 to line 296 with its opposing side connected to ground 328. The first side of transistor 338 is connected 336 to line 308 with its opposing side connected to ground 328. The first side of transistor 344 is connected 342 to line 320 with its opposing side connected to ground 328.

A control signal $V_{sw}(t)$ 284a, 284b is seen coupled to the gates of transistors 282, 288, 332, 304, 310 and 344, while the inverse signal $V_{sw}(t)'$ 318a, 318b is seen coupled to the gates of transistors 292, 298, 324, 316, 322 and 338. It will be appreciated that $V_{sw}(t)$ with its inverse signal are readily obtained from utilizing differentially-ended control outputs.

The switching rate can be chosen to be higher (oversampling) or lower (undersampling) than the signal frequency. The former is preferred as the switching noise can be easily eliminated with the help of low pass filters placed at the ports. For signals at around 1 GHz, however, oversampling requires switch devices operating at several tens of GHz switching rate to avoid switching loss. For an on-chip implementation, in at least one example embodiment the following design parameters were chosen by way of example and not limitation. The switching rate was chosen to be 3 GHz, which corresponds to an 83 ps delay on each transmission line. This corresponds to a straight length of 10 mm trace on GaN substrate and the line occupies an actual area close to 2 mm×1 mm in view of the routing path. With two such delay lines and two transistor switches, the total area of the MMIC should readily fit in a chip area of 3 mm×3 mm.

4. Simulation Results

ADS transient circuit simulation was carried out to validate the disclosed circulator embodiments. Switches are assumed to have a figure of merit similar to what is offered by a typical 0.15 μm gate length GaN HEMT switch with a switch on-resistance of 5 Ohm and off-capacitance of 0.05 pF.

Figure 7:
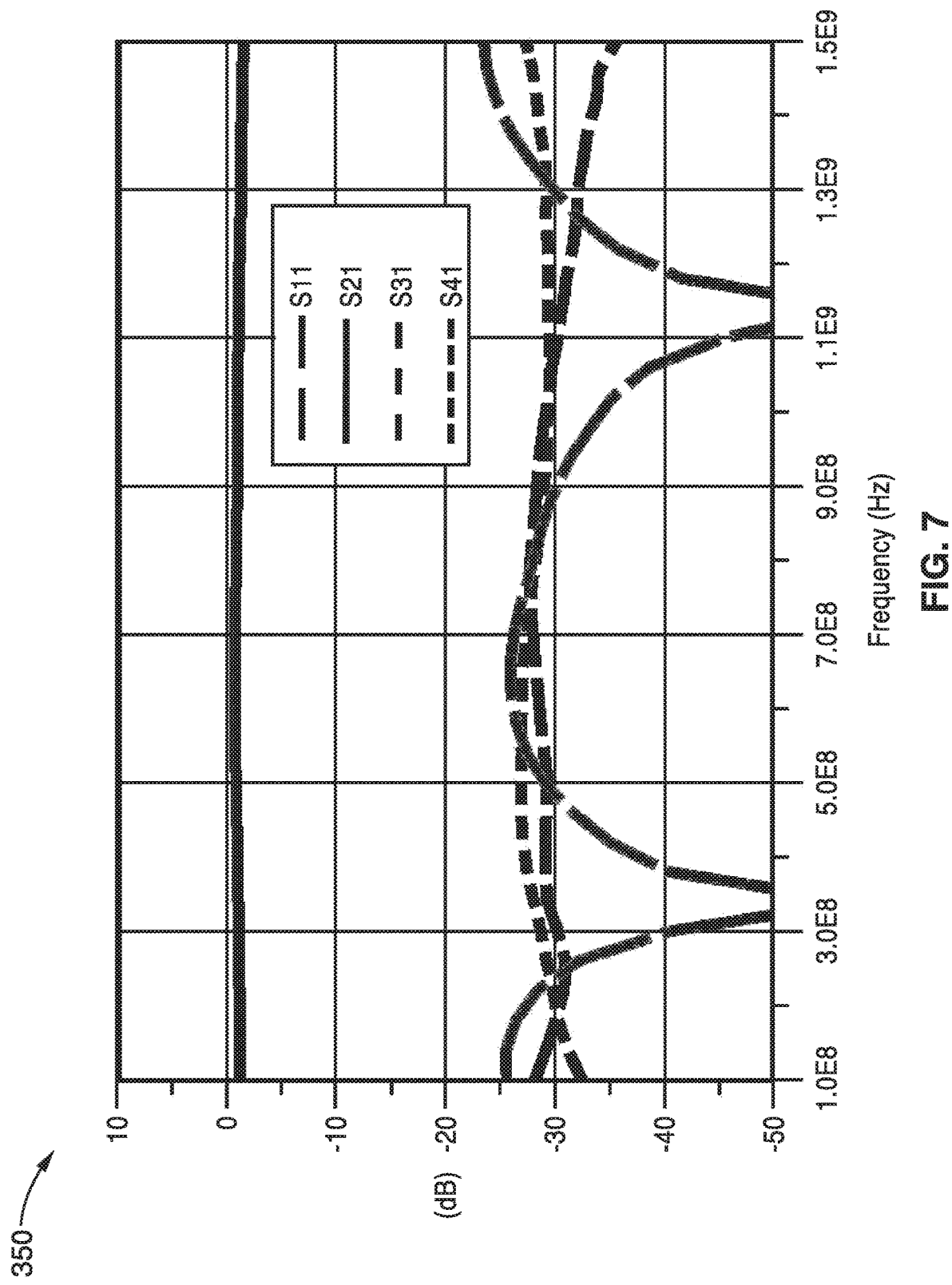
FIG. 7 is a plot of simulated S parameters from port 1 to all the ports over frequency range from 100 MHz to 1.5 GHz, as determined for an embodiment of the present disclosure.

FIG. 7 illustrates simulated scattering parameters 350 from port 1 to all the ports over an ultra-wide frequency band of 100 MHz to 1.5 GHz. It will be noted that the simulated isolation and insertion loss results are shown in the figure show a very flat, greater than 25 dB, isolation is obtained along with insertion losses less than about 1.6 dB for frequencies from 100 MHz to 1.5 GHz. The return loss S11 is shown to be lower than −25 dB over the whole band and it is limited by the return loss of the low pass filter placed at the port. S21 is the feed through from port 1 to port 2, which shows a low insertion loss of less than 1.5 dB over all the frequencies. S31 and S41 are isolation parameters from port 1 to port 3 and port 4, which both appear to be lower than 28 dB, again, limited by both the impedance match of the low pass filters at port 2 and port 3 and the isolation of the DPDT switch.

Due to the symmetry of the physical structure, it is not difficult to derive the rest of the scattering parameters, which should follow the same pattern as depicted in the figure. As only passive switches are involved in the operation, the only power consumption is that of driving the gates of the transistor switches, which should be in the range of a few milliwatts if the aforementioned GaN HEMT devices are used.

5. Conclusions

A general approach of realizing passive, non-reciprocal devices including a two-port gyrator, three-port and four-port circulators based on SSDL has been disclosed. The non-reciprocity of the disclosed devices is achieved over an ultra-wide band, such as from DC to RF. Theoretical models of the non-reciprocity and enabling switching technologies have been discussed. Simulation results validate the approach of the SSDL disclosure. The disclosed SSDL devices may find broad applications in RF front-ends for wireless communications, radar and sensors to protect the receiver from being interfered with by transmitter leakage or to develop novel devices and applications that utilize such broadband non-reciprocity.

From the description herein, it will be appreciated that the present disclosure encompasses multiple embodiments which include, but are not limited to, the following:

1. A non-reciprocal apparatus with multiple ports and sequentially switched delay lines (SSDL), comprising: (a) two transmission line segments, operating as sequentially switched delay lines (SSDL), comprising a first transmission line segment and a second transmission line segment; (b) two active switches comprising a first active switch coupled to proximal ends of said first transmission line segment and second transmission line segment, and a second active switch coupled to distal ends of said first transmission line segment and second transmission line segment; (c) wherein each active switch is configured as at least one port; and (d) wherein said two active switches are configured for switching between said two transmission line segments for a selected time duration before they are switched to the other transmission line for the selected time duration, so that apparatus sequentially turns on and off said two active switches connected to multiple segments of delay lines.

2. A non-reciprocal apparatus with multiple ports and sequentially switched delay lines (SSDL), comprising: (a) two transmission line segments, operating as sequentially switched delay lines (SSDL), comprising a first transmission line segment and a second transmission line segment; (b) two active switches comprising a first active switch coupled to proximal ends of said first transmission line segment and second transmission line segment, and a second active switch coupled to distal ends of said first transmission line segment and second transmission line segment; (c) wherein each active switch is configured as either a single-pole double-throw (SPDT), switch, or as double-pole double-throw (DPDT) switch, with each switch having one or two port outputs; (d) wherein said two active switches are configured for switching between said two transmission line segments for a selected time duration before they are switched to the other transmission line for the selected time duration, so that apparatus sequentially turns on and off said two active switches connected to multiple segments of delay lines; and (e) a control circuit for generating switching control signals to each of said active switches.

3. A non-reciprocal phase shifter, gyrator, apparatus having two ports and sequentially switched delay lines (SSDL), comprising: (a) two transmission line segments, operating as sequentially switched delay lines (SSDL), comprising a first transmission line segment and a second transmission line segment; (b) two active switches comprising single-pole double-throw (SPDT) switches, with a first active switch coupled to proximal ends of said first transmission line segment and second transmission line segment, and a second active switch coupled to distal ends of said first transmission line segment and second transmission line segment; (c) wherein said two active switches are configured for switching between said two transmission line segments for a selected time duration before they are switched to the other transmission line for the selected time duration, so that apparatus sequentially turns on and off said two active switches connected to multiple segments of delay lines; and (d) a control circuit for generating switching control signals to each of said active switches.

4. A non-reciprocal three-port circulator apparatus using sequentially switched delay lines (SSDL), comprising: (a) two transmission line segments, operating as sequentially switched delay lines (SSDL), comprising a first transmission line segment and a second transmission line segment; (b) two active switches comprising a single-pole double-throw (SPDT) switch with a single port output and a double-pole double-throw (DPDT) switch having two port outputs; (c) wherein said two active switches comprise a first active switch coupled to proximal ends of said first transmission line segment and second transmission line segment, and a second active switch coupled to distal ends of said first transmission line segment and second transmission line segment; (d) wherein said two active switches are configured for switching between said two transmission line segments for a selected time duration before they are switched to the other transmission line for the selected time duration, so that apparatus sequentially turns on and off said two active switches connected to multiple segments of delay lines; and (e) a control circuit for generating switching control signals to each of said active switches.

5. A non-reciprocal four-port circulator apparatus having four ports and coupled to sequentially switched delay lines (SSDL), comprising: (a) two transmission line segments, operating as sequentially switched delay lines (SSDL), comprising a first transmission line segment and a second transmission line segment; (b) two active switches comprising double-pole double-throw (DPDT) switches each having two port outputs, in which said two active switches comprise a first active switch coupled to proximal ends of said first transmission line segment and second transmission line segment, and a second active switch coupled to distal ends of said first transmission line segment and second transmission line segment; (c) wherein said two active switches are configured for switching between said two transmission line segments for a selected time duration before they are switched to the other transmission line for the selected time duration, so that apparatus sequentially turns on and off said two active switches connected to multiple segments of delay lines; and (d) a control circuit for generating switching control signals to each of said active switches.

6. The apparatus as recited in any preceding or following embodiment, further comprising a control circuit for generating switching control signals to each of said active switches.

7. The apparatus as recited in any preceding or following embodiment, wherein said control circuit is configured for controlling said two active switches using rectangular waves that have a selected period, with a bi-level voltage selecting the connection to either said first transmission line segment, or said second transmission line segment.

8. The apparatus as recited in any preceding or following embodiment, wherein said apparatus is configured with multiple ports comprising two, three, or four ports.

9. The apparatus as recited in any preceding or following embodiment, wherein said apparatus has two-ports and is configured to operate as a non-reciprocal phase shifter (gyrator).

10. The apparatus as recited in any preceding or following embodiment, wherein said apparatus has three or four ports and is configured to operate as a three-port circulator or a four-port circulator.

11. The apparatus as recited in any preceding or following embodiment, wherein said apparatus separates simultaneous transmit and receive signals at a same frequency in wireless communication systems or radar/sensor systems, to protect a receiver from being interfered with by a transmitter.

12. The apparatus as recited in any preceding or following embodiment, wherein said apparatus is configured for operation at frequencies above 5 kHz.

13. The apparatus as recited in any preceding or following embodiment, wherein said apparatus is configured to provide simultaneous transmit and receive (STAR) of electromagnetic waves without stops or reflections, while providing isolation between the two.

14. The apparatus as recited in any preceding or following embodiment, wherein at least one of said active switches is a single-pole-double-throw (SPDT) switch coupling between a single port and said two transmission line segments.

15. The apparatus as recited in any preceding or following embodiment, wherein said SPDT switch comprises multiple transistors that either provide short circuit reflection when switched off, or provide open circuit reflection when turned off.

16. The apparatus as recited in any preceding or following embodiment, wherein at least one of said active switches is a double-pole-double-throw (DPDT) switch coupling between two ports and said two transmission line segments.

17. The apparatus as recited in any preceding or following embodiment, wherein said DPDT switch comprises multiple transistors that either provide short circuit reflection when switched off, or provide open circuit reflection when turned off.

18. The apparatus as recited in any preceding or following embodiment, wherein said control circuit is configured for controlling said two active switches using rectangular waves that have a selected period, with a bi-level voltage selecting the connection to either said first transmission line segment, or said second transmission line segment.

19. The apparatus as recited in any preceding or following embodiment, wherein said apparatus is configured with multiple ports comprising two, three, or four ports.

20. The apparatus as recited in any preceding or following embodiment, wherein said SPDT switch comprises multiple transistors that either provide short circuit reflection when switched off, or provide open circuit reflection when turned off.

21. The apparatus as recited in any preceding or following embodiment, wherein said DPDT switch comprises multiple transistors that either provide short circuit reflection when switched off, or provide open circuit reflection when turned off.

22. The apparatus as recited in any preceding or following embodiment, wherein said two active switches comprise single-pole double-throw (SPDT) switches and said apparatus has two-ports and is configured to operate as a non-reciprocal phase shifter (gyrator).

23. The apparatus as recited in any preceding or following embodiment, wherein said active switches comprise a single-pole double-throw (SPDT) switch and a double-pole double-throw (DPDT) and the apparatus has three ports and is configured to operate as a three-port circulator.

24. The apparatus as recited in any preceding or following embodiment, wherein said active switches comprise a single-pole double-throw (SPDT) switch and a double-pole double-throw (DPDT) switch, and the apparatus has three ports and is configured to operate as a three-port circulator.

25. The apparatus as recited in any preceding or following embodiment, wherein said active switches comprise two double-pole double-throw (DPDT) switches, and the apparatus has four ports and is configured to operate as a four-port circulator.

26. The apparatus as recited in any preceding or following embodiment, wherein said apparatus is configured to provide simultaneous transmit and receive (STAR) of electromagnetic waves without stops or reflections, while providing isolation between the two.

As used herein, the term "set" refers to a collection of one or more objects. Thus, for example, a set of objects can include a single object or multiple objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. When used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" aligned can refer to a range of angular variation of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural, chemical, and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A non-reciprocal apparatus with multiple ports and sequentially switched delay lines (SSDL), comprising:
   two transmission line segments, operating as sequentially switched delay lines (SSDL), comprising a first transmission line segment and a second transmission line segment;
   two active switches comprising a first active switch coupled to proximal ends of said first transmission line segment and second transmission line segment, and a second active switch coupled to distal ends of said first transmission line segment and second transmission line segment;
   wherein each active switch is configured as at least one port; and
   wherein said two active switches are configured for switching between said two transmission line segments for a selected time duration before they are switched to the other transmission line for the selected time duration, so that apparatus sequentially turns on and off said two active switches connected to multiple segments of delay lines.

2. The apparatus as recited in claim 1, further comprising a control circuit for generating switching control signals to each of said active switches.

3. The apparatus as recited in claim 1, wherein said apparatus is configured with multiple ports.

4. The apparatus as recited in claim 1, wherein said apparatus has two-ports and is configured to operate as a non-reciprocal phase shifter (gyrator).

5. The apparatus as recited in claim 1, wherein said apparatus has three or four ports and is configured to operate as a three-port circulator or a four-port circulator.

6. The apparatus as recited in claim 1, wherein said apparatus separates simultaneous transmit and receive signals at a same frequency in wireless communication systems or radar/sensor systems, to protect a receiver from being interfered with by a transmitter.

7. The apparatus as recited in claim 1, wherein said apparatus is configured for operation at frequencies above 5 kHz.

8. The apparatus as recited in claim 1, wherein said apparatus is configured to provide simultaneous transmit and receive (STAR) of electromagnetic waves without stops or reflections, while providing isolation between the two.

9. The apparatus as recited in claim 1, wherein at least one of said active switches is a double-pole-double-throw (DPDT) switch coupling between two ports and said two transmission line segments.

10. The apparatus as recited in claim 1, wherein at least one of said active switches is a single-pole-double-throw (SPDT) switch coupling between a single port and said two transmission line segments.

11. The apparatus as recited in claim 10, wherein said SPDT switch comprises multiple transistors that either provide short circuit reflection when switched off, or provide open circuit reflection when turned off.

12. A non-reciprocal apparatus with multiple ports and sequentially switched delay lines (SSDL), comprising:
    two transmission line segments, operating as sequentially switched delay lines (SSDL), comprising a first transmission line segment and a second transmission line segment;
    two active switches comprising a first active switch coupled to proximal ends of said first transmission line segment and second transmission line segment, and a second active switch coupled to distal ends of said first transmission line segment and second transmission line segment;
    wherein each active switch is configured as at least one port; and
    wherein said two active switches are configured for switching between said two transmission line segments for a selected time duration before they are switched to the other transmission line for the selected time duration, so that apparatus sequentially turns on and off said two active switches connected to multiple segments of delay lines; and
    a control circuit for generating switching control signals to each of said active switches;
    wherein said control circuit is configured for controlling said two active switches using rectangular waves that have a selected period, with a bi-level voltage selecting the connection to either said first transmission line segment, or said second transmission line segment.

13. A non-reciprocal apparatus with multiple ports and sequentially switched delay lines (SSDL), comprising:
    two transmission line segments, operating as sequentially switched delay lines (SSDL), comprising a first transmission line segment and a second transmission line segment;
    two active switches comprising a first active switch coupled to proximal ends of said first transmission line segment and second transmission line segment, and a second active switch coupled to distal ends of said first transmission line segment and second transmission line segment;
    wherein each active switch is configured as at least one port; and
    wherein said two active switches are configured for switching between said two transmission line segments for a selected time duration before they are switched to the other transmission line for the selected time duration, so that apparatus sequentially turns on and off said two active switches connected to multiple segments of delay lines;
    wherein at least one of said active switches is a double-pole-double-throw (DPDT) switch coupling between two ports and said two transmission line segments; and
    wherein said DPDT switch comprises multiple transistors that either provide short circuit reflection when switched off, or provide open circuit reflection when turned off.

14. A non-reciprocal apparatus with multiple ports and sequentially switched delay lines (SSDL), comprising:
    two transmission line segments, operating as sequentially switched delay lines (SSDL), comprising a first transmission line segment and a second transmission line segment;
    two active switches comprising a first active switch coupled to proximal ends of said first transmission line segment and second transmission line segment, and a second active switch coupled to distal ends of said first transmission line segment and second transmission line segment;
    wherein each active switch is configured as either a single-pole double-throw (SPDT), switch, or as a double-pole double-throw (DPDT) switch, with each switch having one or two port outputs;
    wherein said two active switches are configured for switching between said two transmission line segments for a selected time duration before they are switched to the other transmission line for the selected time duration, so that apparatus sequentially turns on and off said two active switches connected to multiple segments of delay lines; and
    a control circuit for generating switching control signals to each of said active switches.

15. The apparatus as recited in claim 14, wherein said apparatus is configured with multiple ports comprising two, three, or four ports.

16. The apparatus as recited in claim 14, wherein said SPDT switch comprises multiple transistors that either provide short circuit reflection when switched off, or provide open circuit reflection when turned off.

17. The apparatus as recited in claim 14, wherein said two active switches comprise single-pole double-throw (SPDT) switches and said apparatus has two-ports and is configured to operate as a non-reciprocal phase shifter (gyrator).

18. The apparatus as recited in claim 14, wherein said active switches comprise a single-pole double-throw (SPDT) switch and a double-pole double-throw (DPDT) and the apparatus has three ports and is configured to operate as a three-port circulator.

19. The apparatus as recited in claim 14, wherein said active switches comprise a single-pole double-throw (SPDT) switch and a double-pole double-throw (DPDT) switch, and the apparatus has three ports and is configured to operate as a three-port circulator.

20. The apparatus as recited in claim 14, wherein said active switches comprise two double-pole double-throw (DPDT) switches, and the apparatus has four ports and is configured to operate as a four-port circulator.

21. The apparatus as recited in claim 14, wherein said apparatus is configured to provide simultaneous transmit and receive (STAR) of electromagnetic waves without stops or reflections, while providing isolation between the two.

22. A non-reciprocal apparatus with multiple ports and sequentially switched delay lines (SSDL), comprising:

two transmission line segments, operating as sequentially switched delay lines (SSDL), comprising a first transmission line segment and a second transmission line segment;
two active switches comprising a first active switch coupled to proximal ends of said first transmission line segment and second transmission line segment, and a second active switch coupled to distal ends of said first transmission line segment and second transmission line segment;
wherein each active switch is configured as either a single-pole double-throw (SPDT), switch, or as a double-pole double-throw (DPDT) switch, with each switch having one or two port outputs;
wherein said two active switches are configured for switching between said two transmission line segments for a selected time duration before they are switched to the other transmission line for the selected time duration, so that apparatus sequentially turns on and off said two active switches connected to multiple segments of delay lines; and
a control circuit for generating switching control signals to each of said active switches;
wherein said control circuit is configured for controlling said two active switches using rectangular waves that have a selected period, with a bi-level voltage selecting the connection to either said first transmission line segment, or said second transmission line segment.

23. A non-reciprocal apparatus with multiple ports and sequentially switched delay lines (SSDL), comprising:
two transmission line segments, operating as sequentially switched delay lines (SSDL), comprising a first transmission line segment and a second transmission line segment;
two active switches comprising a first active switch coupled to proximal ends of said first transmission line segment and second transmission line segment, and a second active switch coupled to distal ends of said first transmission line segment and second transmission line segment;
wherein each active switch is configured as either a single-pole double-throw (SPDT), switch, or as a double-pole double-throw (DPDT) switch, with each switch having one or two port outputs;
wherein said two active switches are configured for switching between said two transmission line segments for a selected time duration before they are switched to the other transmission line for the selected time duration, so that apparatus sequentially turns on and off said two active switches connected to multiple segments of delay lines; and
a control circuit for generating switching control signals to each of said active switches;
wherein said DPDT switch comprises multiple transistors that either provide short circuit reflection when switched off, or provide open circuit reflection when turned off.

24. A non-reciprocal phase shifter, gyrator, apparatus having two ports and sequentially switched delay lines (SSDL), comprising:
two transmission line segments, operating as sequentially switched delay lines (SSDL), comprising a first transmission line segment and a second transmission line segment;
two active switches comprising single-pole double-throw (SPDT) switches, with a first active switch coupled to proximal ends of said first transmission line segment and second transmission line segment, and a second active switch coupled to distal ends of said first transmission line segment and second transmission line segment;
wherein said two active switches are configured for switching between said two transmission line segments for a selected time duration before they are switched to the other transmission line for the selected time duration, so that apparatus sequentially turns on and off said two active switches connected to multiple segments of delay lines; and
a control circuit for generating switching control signals to each of said active switches.

25. A non-reciprocal three-port circulator apparatus using sequentially switched delay lines (SSDL), comprising:
two transmission line segments, operating as sequentially switched delay lines (SSDL), comprising a first transmission line segment and a second transmission line segment;
two active switches comprising a single-pole double-throw (SPDT) switch with a single port output and a double-pole double-throw (DPDT) switch having two port outputs;
wherein said two active switches comprise a first active switch coupled to proximal ends of said first transmission line segment and second transmission line segment, and a second active switch coupled to distal ends of said first transmission line segment and second transmission line segment;
wherein said two active switches are configured for switching between said two transmission line segments for a selected time duration before they are switched to the other transmission line for the selected time duration, so that apparatus sequentially turns on and off said two active switches connected to multiple segments of delay lines; and
a control circuit for generating switching control signals to each of said active switches.

26. A non-reciprocal four-port circulator apparatus having four ports and coupled to sequentially switched delay lines (SSDL), comprising:
two transmission line segments, operating as sequentially switched delay lines (SSDL), comprising a first transmission line segment and a second transmission line segment;
two active switches comprising double-pole double-throw (DPDT) switches each having two port outputs, in which said two active switches comprise a first active switch coupled to proximal ends of said first transmission line segment and second transmission line segment, and a second active switch coupled to distal ends of said first transmission line segment and second transmission line segment;
wherein said two active switches are configured for switching between said two transmission line segments for a selected time duration before they are switched to the other transmission line for the selected time duration, so that apparatus sequentially turns on and off said two active switches connected to multiple segments of delay lines; and
a control circuit for generating switching control signals to each of said active switches.

* * * * *